(12) United States Patent
Wahl

(10) Patent No.: US 7,791,139 B2
(45) Date of Patent: Sep. 7, 2010

(54) INTEGRATED CIRCUIT INCLUDING A SEMICONDUCTOR ASSEMBLY IN THIN-SOI TECHNOLOGY

(75) Inventor: Uwe Wahl, Munich (DE)

(73) Assignee: Infineon Technologies Austria AG, Villach (AT)

( * ) Notice: Subject to any disclaimer, the term of this patent is extended or adjusted under 35 U.S.C. 154(b) by 234 days.

(21) Appl. No.: 11/829,264

(22) Filed: Jul. 27, 2007

(65) Prior Publication Data
US 2009/0026542 A1    Jan. 29, 2009

(51) Int. Cl.
*H01L 27/02* (2006.01)
(52) U.S. Cl. .............................. 257/347; 257/E27.112
(58) Field of Classification Search ................ 257/347, 257/365, E27.112
See application file for complete search history.

(56) References Cited

U.S. PATENT DOCUMENTS

| 5,889,293 A | 3/1999 | Rutten et al. |
| 5,923,067 A * | 7/1999 | Voldman ................. 257/349 |
| 6,100,567 A * | 8/2000 | Burr ........................... 257/365 |
| 6,498,372 B2 | 12/2002 | Brown et al. |
| 6,693,327 B2 | 2/2004 | Priefert et al. |

FOREIGN PATENT DOCUMENTS

DE    10106359 C1    9/2002
WO    2005076366 A2    8/2005

OTHER PUBLICATIONS

"ESD in Silicon Integrated Circuits", Ajith Amerasekera, et al., Second Edition 2002, John Wiley & Sons, Ltd.

* cited by examiner

*Primary Examiner*—Thomas L Dickey
(74) *Attorney, Agent, or Firm*—Dicke, Billig & Czaja, PLLC

(57) ABSTRACT

An integrated circuit including a semiconductor assembly in thin-film SOI technology is disclosed. One embodiment provides a semiconductor assembly in thin-film SOI technology including a first semiconductor substrate structure of a second conductivity type inverse to a first conductivity type in a semiconductor substrate below a first semiconductor layer, a second semiconductor substrate structure of a second conductivity type in a semiconductor substrate below a second semiconductor layer structure, and a third semiconductor substrate structure of the first conductivity type below the first semiconductor layer structure in the semiconductor substrate and otherwise surrounded by the first semiconductor substrate structure.

30 Claims, 10 Drawing Sheets

INTEGRATED CIRCUIT INCLUDING A SEMICONDUCTOR ASSEMBLY IN THIN-SOI TECHNOLOGY

BACKGROUND

The present invention relates to semiconductor assemblies in thin-film SOI (Silicon on Insulator) technology.

Semiconductors in thin-film SOI technology include a semiconductor substrate on which an insulator layer is applied and on which in turn a semiconductor layer is arranged. The switching elements and circuits in SOI technology are arranged on the insulator and/or the insulator layer.

In contrast to assemblies including transistors which are, for example, manufactured directly on a silicon wafer, the transistors in SOI technology on the insulator layer include a lower capacitance so that the charges required up to switching may be reduced resulting in shorter switching times and lower power consumption. At the same time, smaller heat losses and thus lower requirements to cooling result from the reduced power consumption.

Due to the small film thickness of the semiconductor layer on the insulator layer in SOI technology, the ESD (Electrostatic Discharge) stability is frequently limited conceptually, since the energy of an ESD pulse typically has to be degraded in the semiconductor layer which, however, due to the insulator layer, exhibits strongly reduced thermal coupling.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1A:
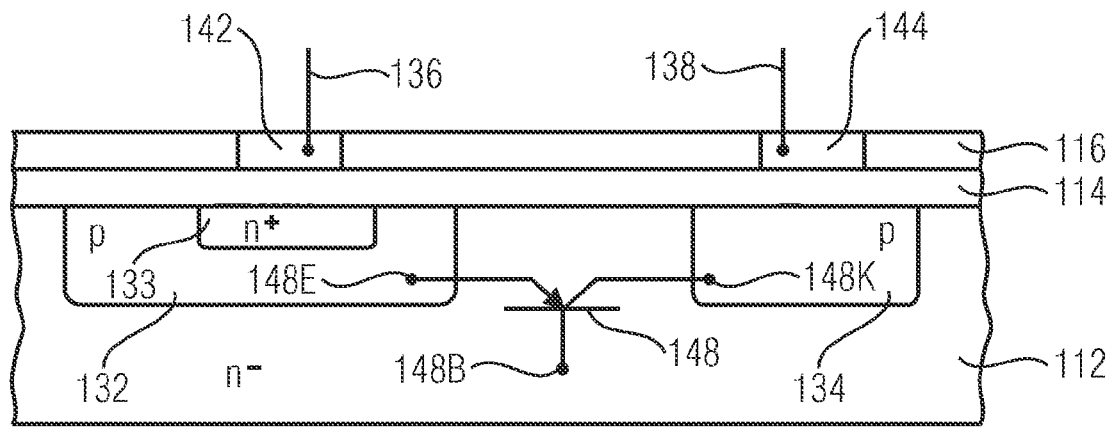
FIG. 1A illustrates a first embodiment of an integrated circuit including a semiconductor assembly in thin-film SOI technology.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In the present application, same reference numerals will be used for elements and functional units having the same or similar functional characteristics. In this context, it is to be pointed out that, unless explicitly indicated otherwise, portions referring to objects having similar or same functional characteristics are interchangeable among descriptions of different embodiments.

Embodiments of the present invention provide an integrated circuit including a semiconductor assembly in thin-film SOI (Silicon on Insulator) technology. In one embodiment, the semiconductor assembly includes a semiconductor substrate of a first conductivity type, an insulator layer and a semiconductor layer, wherein the insulator layer is arranged on the semiconductor substrate and the semiconductor layer is arranged on the insulator layer, further including: a first semiconductor layer structure in the semiconductor layer, wherein the first semiconductor layer structure is connectable to a first voltage potential; a second semiconductor layer structure in the semiconductor layer which is separate and laterally spaced apart from the first semiconductor layer structure, wherein the second semiconductor layer structure is connectable to a second voltage potential; a first semiconductor substrate structure of a second conductivity type inverse to the first conductivity type which is arranged in the semiconductor substrate below the first semiconductor layer structure; a second semiconductor substrate structure of the second conductivity type which is arranged in the semiconductor substrate below the second semiconductor layer structure and is laterally spaced apart from the first semiconductor substrate structure; and a third semiconductor substrate structure of the first conductivity type which is arranged below the first semiconductor layer structure in the semiconductor substrate and otherwise surrounded by the first semiconductor substrate structure.

Embodiments of the semiconductor assembly allow reducing interferences caused by parasitic bipolar transistor structures formed by the first semiconductor substrate structure, the second semiconductor substrate structure and the semiconductor substrate.

Embodiments of the semiconductor assembly further allow using the "parasitic bipolar transistor structure" mentioned before and/or other bipolar transistor structures which are exemplarily formed by the third semiconductor substrate structure, the first semiconductor substrate structure and the semiconductor substrate, as ESD (Electrostatic Discharge) protective elements in thin-film SOI semiconductor assemblies to protect them from electrostatic discharges and/or voltages in general which are greater than a predetermined voltage value.

Another embodiment provides a semiconductor assembly in thin-film SOI technology including a semiconductor substrate of a first conductivity type, an insulator layer and a semiconductor layer, wherein the insulator layer is arranged on the semiconductor substrate and the semiconductor layer is arranged on the insulator layer, further including: a first semiconductor substrate structure of a second conductivity type inverse to the first conductivity type in the semiconductor substrate, wherein the first semiconductor substrate structure in connectable to a first voltage potential; a second semiconductor substrate structure of the second conductivity type which is arranged separate and laterally spaced apart from the first semiconductor substrate structure in the semiconductor substrate, wherein the second semiconductor substrate structure is connectable to a second voltage potential different from the first voltage potential, wherein the first semiconductor substrate structure, the second semiconductor substrate structure and the semiconductor substrate form a bipolar transistor, and wherein the first semiconductor substrate structure and the second semiconductor substrate structure are spaced apart such that the bipolar transistor switches between the first semiconductor substrate structure and the second semiconductor substrate structure at a predetermined potential difference.

Embodiments of the semiconductor assembly may be employed as ESD (Electrostatic Discharge) protective elements in thin-film SOI semiconductor assemblies to protect same from electrostatic discharges and/or voltages in general which are greater than a predetermined voltage value.

FIG. 1A illustrates an integrated circuit including a semiconductor assembly 130 in thin-film SOI technology including a semiconductor substrate of a first conductivity type, an insulator layer 114 and a semiconductor layer 116, wherein the insulator layer 114 is arranged on the semiconductor substrate 112 and the semiconductor layer 116 is arranged on the insulator layer 114. The semiconductor assembly 130 further includes a first semiconductor layer structure 142 in the semiconductor layer 116, wherein the first semiconductor layer structure 142 is connectable to a first voltage potential and/or a first terminal 136. The semiconductor assembly 130 includes a second semiconductor layer structure 144 in the semiconductor layer 116 which is separate and laterally spaced apart from the first semiconductor layer structure, wherein the second semiconductor layer structure 144 is connectable to a second voltage potential and/or a second terminal 138. In the semiconductor substrate 112, the semiconductor assembly 130 includes a first semiconductor substrate structure 132 of a second conductivity type inverse to the first conductivity type which is arranged below the semiconductor layer structure 142. In the semiconductor substrate 112, the semiconductor assembly 130 further includes a second semiconductor substrate structure 134 of the second conductivity type which is arranged below the second semiconductor layer structure 144 and is laterally spaced apart from the first semiconductor substrate structure. In addition, the semiconductor assembly 130 includes a third semiconductor substrate structure 133 of the first conductivity type which is arranged below the first semiconductor layer structure 142 in the semiconductor substrate 112, abuts on the insulator layer 114 and is otherwise surrounded by the first semiconductor substrate structure 132.

As mentioned before, the actual circuit and/or the circuit elements and circuits in SOI technology are arranged in the semiconductor layer 116 on the insulator layer 114. However, additional semiconductor substrate structures are arranged in the semiconductor substrate 112 and are partly electrically connected to the overlying switching elements and/or semiconductor layer structures to exemplarily generate more homogenous electrical fields and thus improve the switching characteristics of the overlying switching elements. Applications are, for example, CMOS driver stages and high-voltage level shifters which will be explained in greater detail below referring to FIGS. 1C and 1D.

However, as is illustrated in FIG. 1A, the result may be an assembly in which the first semiconductor substrate structure 132, the second semiconductor substrate structure 134 and the semiconductor substrate structure 112 form a bipolar transistor 148. When the first semiconductor substrate structure 132 and the second semiconductor substrate structure 134 include different voltage potentials and when the semiconductor substrate 112 is not connected to a defined potential, small voltage differences between an emitter 148E and base 148B may result in unintentionally switching on the bipolar transistor structure. This situation may, for example, occur when, due to the design of the semiconductor assembly, when operating same, the first semiconductor substrate structure 132 and the second semiconductor substrate structure 134 are connected to different voltage potentials and the bipolar transistor structure 138 and/or switching thereof was not intended when designing the semiconductor assembly. In this context, the bipolar transistor structure 148 is also referred to as parasitic bipolar transistor.

Embodiments according to FIG. 1A allow the third semiconductor substrate structure 133 to have a different voltage potential than the second semiconductor substrate structure 134, exemplarily due to different requirements of overlying semiconductor layer structures 142, 144, without the first semiconductor substrate structure 132 to include the voltage potential of the third semiconductor substrate structure 133 and thus a defined voltage potential different from the second semiconductor substrate structure. Thus, interferences of the parasitic bipolar transistor 148 and/or the probability of unintended switching can be reduced.

In the embodiment illustrated in FIG. 1A, the first conductivity type is an n-type doping and the second conductivity type is a p-type doping.

In addition, in the embodiment illustrated in FIG. 1A, the semiconductor substrate 112 includes an n$^-$-type doping, the first semiconductor substrate structure 132 and the second semiconductor substrate structure 134 include a p-type doping and the third semiconductor substrate structure 133 includes an n$^+$-type doping. Correspondingly, the first semiconductor substrate structure 132 forms the emitter 148E, the semiconductor substrate 112 forms the base 148B and the second semiconductor substrate structure 134 forms the collector 148K of the pnp-bipolar transistor 148.

In embodiments of the semiconductor assembly, the first semiconductor substrate structure 132 and the second semiconductor substrate structure 134 have higher or considerably higher doping than the semiconductor substrate 112, exemplarily the semiconductor substrate 112 has an n$^-$ type doping and the semiconductor substrate structures 132, 134 have a p-type, p$^+$-type or p$^{++}$-type doping. In embodiments, the third semiconductor substrate structure 133 includes a similar or higher doping than the first and second semiconductor substrate structures 132, 134, exemplarily the first and second semiconductor substrate structures include a p-type doping and the third semiconductor substrate structure 133 includes an n$^+$-type or n$^{++}$-type doping.

Typical doping ranges are 40 to 300 Ohm cm for an n$^-$-type doping, 5 to 40 Ohm cm for an n-type doping, 50 to 2000 mOhm cm for an n$^+$-type doping and <50 mOhm cm for an n$^{-+}$-type doping.

This also applies in alternative embodiments in which the first conductivity type is a p-type doping and the second conductivity type is an n-type doping.

In further embodiments, the third semiconductor substrate structure 133 may be abutting on the insulator layer 114 and only be surrounded partly be the first semiconductor structure 132 or completely surrounded by it.

The semiconductor substrate 112 may be a silicon substrate, the insulator layer 114 may, for example, be an oxide-based layer, such as, for example, silicon dioxide SiO$_2$, and the semiconductor layer 116 may, for example, be a silicon film on which semiconductor structures, for example, are defined by corresponding doping. Apart from this, insulating structures may also be defined in the semiconductor layer 116 to electrically insulate conductor structures and semiconductor elements from other conductor and semiconductor structures within the semiconductor layer 116.

Figure 1B:
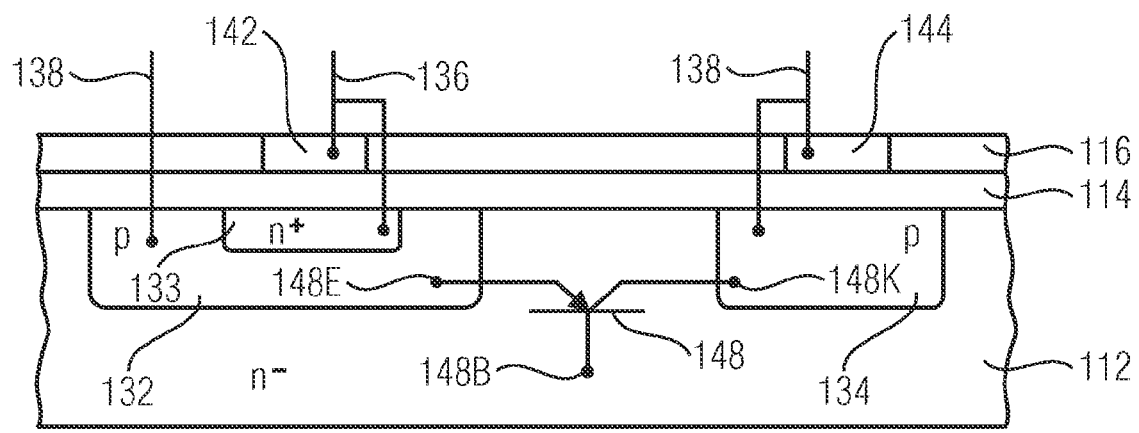
FIG. 1B illustrates a second embodiment of a semiconductor assembly in thin-film SOI technology.

FIG. 1B illustrates an embodiment of the semiconductor assembly 130' basically corresponding to that of FIG. 1A. In contrast to FIG. 1A, it is additionally illustrated that the third semiconductor substrate structure 133 is connectable and/or connected to the first voltage potential 136 and the second semiconductor substrate structure 134 is connectable and/or connected to the second voltage potential 138.

In the embodiment illustrated in FIG. 1B, the second semiconductor substrate structure 134 is arranged as a p-well below the second semiconductor layer assembly 144 and additionally both of them are connectable and/or connected to the second voltage potential 138. Equally, the third semiconductor substrate structure 133 is arranged as an n$^+$-well below the first semiconductor layer structure 142 and in the first semiconductor substrate structure 132 and in addition, as is the first semiconductor layer structure 142, is connectable and/or connected to the first voltage potential 136.

It is avoided by the double well structure 132, 133 of the first semiconductor substrate structure 132 and the third semiconductor substrate structure 133 in which only the interior well and/or the third semiconductor substrate structure 133 is connected to the first voltage potential that, with a voltage and/or potential difference between the first voltage potential 136 and the second voltage potential 138, the first semiconductor substrate structure 132 and/or the first p-well 132 and the second semiconductor substrate structure and/or second p-well 134 include different voltage potentials and the pnp transistor 148, as has been described before, unintendedly switches already with low voltage differences between the emitter 148E and the base 148B.

"Unintended switching" here is to express that a transistor current flow caused thereby between the first semiconductor substrate structure 132 and the second semiconductor substrate structure 134 through the semiconductor substrate 112 was not desired when designing the circuit, which means that the bipolar transistor 148 is a parasitic bipolar transistor.

Embodiments of the double well structure described before thus allow reducing the parasitic influences of the bipolar transistor 148 on the semiconductor assembly.

In further embodiments, the first semiconductor substrate structure 132 is additionally connectable and/or connected to the second voltage potential 138. Thus, the first semiconductor substrate structure 132 and the second semiconductor substrate structure 134 have the same voltage potential so that the parasitic influences of the bipolar transistor 148 can be further reduced; in particular in semiconductor assemblies in which the semiconductor substrate 112 and/or the base 14B of the parasitic transistor is not connected to a defined voltage potential.

In general, the third semiconductor substrate structure (133) is implemented to obtain, when applying the first voltage potential (136) to it a p-n junction between the first semiconductor substrate structure (132) and the third semiconductor substrate structure (133) in reverse direction.

Figure 1C:
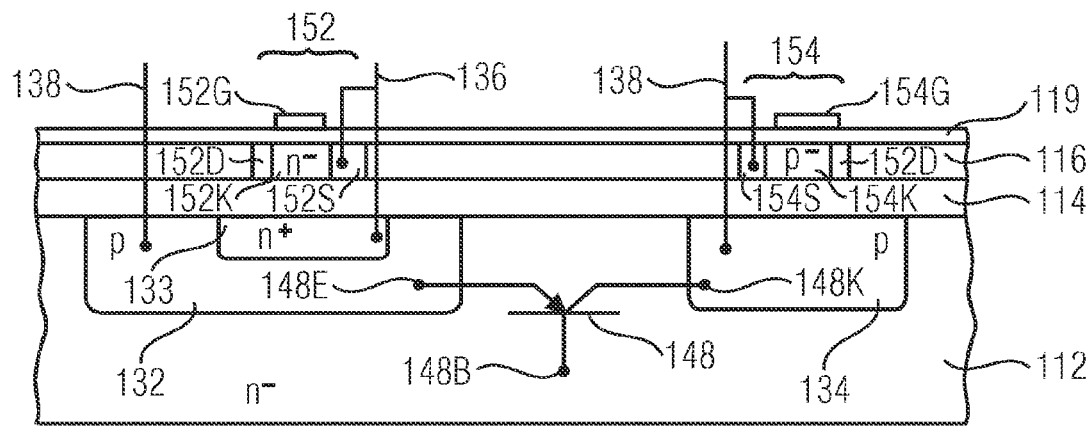
FIG. 1C illustrates an embodiment of a semiconductor assembly according to FIGS. 1A and 1B in a CMOS (Complementary Metal Oxide Semiconductor) driver stage.

FIG. 1C illustrates an embodiment of a CMOS semiconductor assembly 132" including a pMOS transistor 152 and an nMOS transistor 154, wherein the first semiconductor layer structure 152S (corresponds to the reference numeral 142 in FIGS. 1A and 1B) is part of the pMOS transistor and the second semiconductor layer structure 154S (corresponds to the reference numeral 144 in FIGS. 1A and 1B) is part of the nMOS transistor.

The pMOS transistor 152 includes a source structure 152S, a drain structure 152D and a channel structure 152K in the semiconductor layer structure 116, and a gate structure 152G above the channel zone 152K, which is electrically insulated and/or separated from it and the drain structure 152D and the source structure 152S by a second insulator layer 119. The p-channel exemplarily includes an n-type doping and/or, in general, a first conductivity type. The nMOS transistor 154 includes a source structure 154S, a channel structure 154K and a drain structure 154D in the semiconductor layer 116, and a gate structure 154G above the channel structure 154K, which is electrically insulated and/or separated from the remaining elements of the transistor by the second insulator layer 119. Exemplarily, the channel 154K includes a p-type doping and/or, in general, a second conductivity type.

The first semiconductor substrate structure 132 and the second semiconductor substrate structure 133 are arranged below the pMOS transistor 152. The second semiconductor substrate structure 132 is arranged below the nMOS transistor 154.

CMOS semiconductor assemblies of this kind are, for example, used as high-voltage-side CMOS output driver stages in integrated circuits (ICs) for bridge applications, such as, for example, for half bridges, H bridges or full bridges. In order not to reduce the performance of the output transistors by the back gate effect, there are separate p islands and/or p-doped semiconductor substrate structures 132, 134 for the pMOS output transistors 152 and nMOS output transistors 154 of the CMOS driver stage below the circuit blocks. The parasitic PNP transistor 148 in applications like this one is due to the concept and, without the third semiconductor substrate structure 133, may sporadically result in yield losses.

p-doped semiconductor substrate structures are also referred to as p-islands and/or p-wells, whereas n-doped semiconductor substrate structures are also referred to as n-islands and/or n-wells.

The p-island 134 below the nMOS transistor 154 is at the potential of the high-voltage ground $V_s$ and/or the second voltage potential 138, whereas the p-island 132 below the pMOS transistor—without the n$^+$-well 133—would be at the voltage potential of the supply voltage of the high-voltage side $V_B$ and/or the second voltage potential 136. The result here would be a difference in voltage between the p-islands 132 and 134. The emitter 148E would be at the first voltage potential and/or $V_B$ potential, the collector 148K would be at the second voltage potential and/or ground. If the base 148B and/or the semiconductor substrate region between the p-islands is not connected to a defined potential, as may for example, be the case in semiconductor assemblies for rotating field applications for engine control in which the base and/or the base potential is self-regulating, lower voltage differences between the base 148B and the emitter 148E, as described before, may result in the parasitic pnp transistor structure 148 to be switched on. This is all the more true with high barrier layer temperatures which are easily reached in high-voltage applications.

Thus, the behavior of the pnp transistor is relatively hard to predict since it is decisively dependant on the distance of the p-islands, but also on the doping of the semiconductor substrate and/or n$^-$-region between the p-islands.

Embodiments, as have been described referring to FIGS. 1A-1C, reduce the interferences of the parasitic pnp transistor 148 by the double well structure 132, 133 and/or inserting the third semiconductor region 133 in the first semiconductor structure 132. If the first semiconductor substrate region 132 is additionally connected to the second voltage potential 138, both the first semiconductor region and the second semiconductor region will be at the same potential, despite the different CMOS parts.

FIG. 1C illustrates an embodiment in which the first conductivity type is an n-type doping and the second conductivity type is a p-type doping. In alternative embodiments, the first conductivity type may also be a p-type doping and the second conductivity type may be an n-type doping. Correspondingly, the transistor 152 will be an nMOS transistor and the transistor 154 will be a pMOS transistor of the CMOS semiconductor assembly. Correspondingly, the first semiconductor layer structure 152S will be part of the nMOS transistor 152 and the second semiconductor layer structure 154S will be part of the pMOS transistor 154.

Embodiments are not limited to, for example, a single CMOS semiconductor assembly as is illustrated in FIG. 1C, but may also be used for any semiconductor assemblies having any number of semiconductor layer structures of the first conductivity type, wherein it is made possible by inserting semiconductor substrate structures of the first conductivity type and/or embedding them between the semiconductor substrate structures of the first conductivity type and the insulator layer for all semiconductor substrate structures of the first conductivity type to be at a voltage potential, and thus switching the parasitic bipolar transistors is avoided.

Figure 1D:
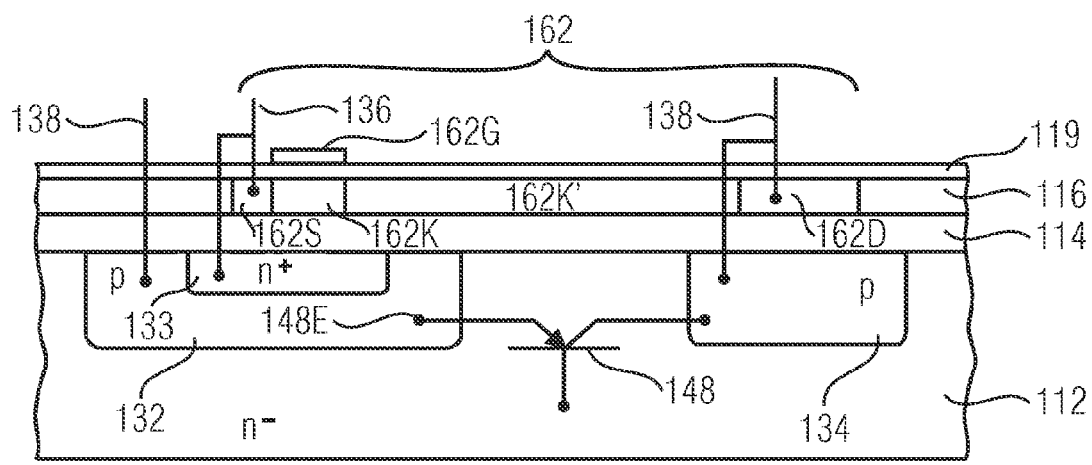
FIG. 1D illustrates an embodiment of a semiconductor assembly according to FIGS. 1A and 1B in a high-voltage level shifter.

FIG. 1D illustrates a semiconductor assembly in thin-film SOI technology 130''' for a high-voltage level shifter. The high-voltage level shifter 162 includes a source structure 162S, a channel structure 162K, a drift structure 162K' and a drain structure 162D in the semiconductor layer 116 and a gate structure 162G above the channel structure 162K which is electrically insulated and/or separated from the semiconductor layer 116 by a second insulator layer 119. The first semiconductor substrate structure 132 and the third semiconductor substrate structure 133 are arranged below the source region 162S and the channel structure 162K, wherein the source structure 162S corresponds to the first semiconductor layer structure 142 of FIGS. 1A and 1B. The second semiconductor substrate structure 134 is arranged below the drain structure 162D of the high-voltage level shifter 162, wherein the drain structure 162D corresponds to the second semiconductor layer structure 144 of FIGS. 1A and 1B. The third semiconductor substrate structure 133, as is the source structure 162S, is connectable or connected to the first voltage potential and the first semiconductor substrate structure 132, the second semiconductor substrate structure 134 and the second semiconductor layer structure 162D and/or the drain structure 162D is connectable or connected to the second voltage potential 138.

In analogy to the discussion of FIGS. 1A to 1C, it can be achieved by using the double well structure of the first semiconductor substrate structure 132 and the third semiconductor substrate structure 133 that the source structure 162S, the first semiconductor substrate structure and the second semiconductor substrate structure 132, 134, despite different voltage potentials, are connectable to the same voltage potential and thus the parasitic effects of the bipolar transistor 148 can be reduced.

Figure 2A:
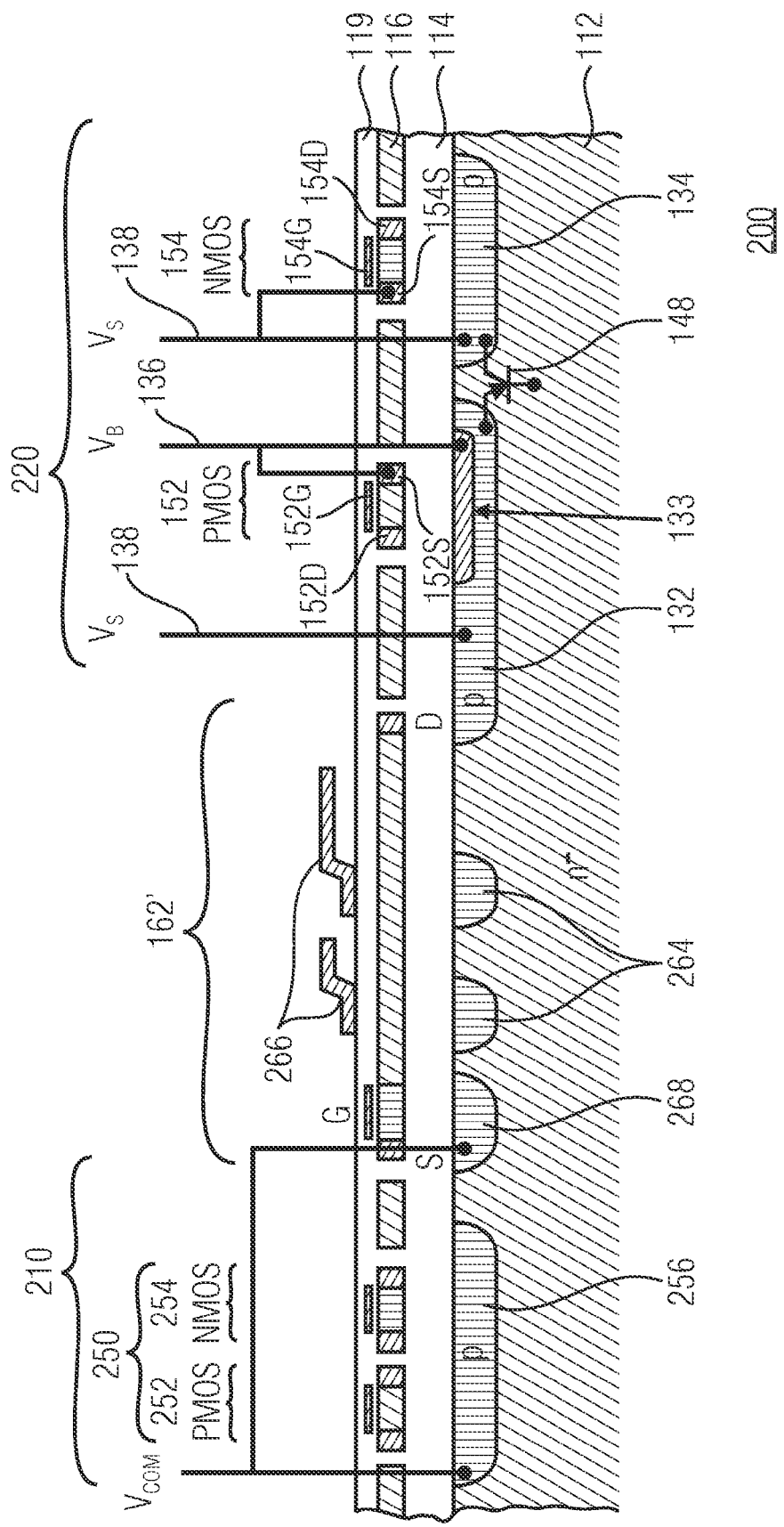
FIG. 2A illustrates an embodiment according to FIG. 1C in a high-voltage application.

FIG. 2A illustrates a semiconductor assembly for a high-voltage application including a monolithic integration of a low-voltage island 210 which is also referred to as low-side island and a high-voltage island 120 which is also referred to as high-side island, which are connected via a high-voltage level shifter 162' which is also referred as to HV level shifter.

In such a high-voltage thin-film SOI technology, p-islands 132, 134 are arranged in an n$^-$-substrate 112 below the buried oxide (BOX) 114 to achieve a blocking capability of more than 600 volts. Apart form the high blocking voltage, this concept nevertheless allows, despite the low BOX thickness, realization of completely shielded circuit blocks on the high-voltage side 220. The high-voltage island 220 includes a CMOS output driver, as has already been described exemplarily referring to FIG. 1C. The low-voltage island 210 includes a CMOS input driver 250 including the pMOS part 252 and the nMOS part 254 below which a continuous p-well and/or semiconductor substrate structure 256 of a second conductivity type is arranged. The semiconductor assembly additionally includes a high-voltage level shifter 162' connecting the low-voltage island 210 and the high-voltage island 220. In contrast to the high-voltage level shifter according to FIG. 1D, the high-voltage level shifter 162' additionally includes field zones 264 and field plates 266 for improving the switching characteristics.

The parasitic PNP structure 148 discussed before results from the p-islands 132, 134 in the n$^-$-type substrate 112. With high barrier layer temperatures, this may result in an undesired increase in the leakage current in reverse operation, as is conventional in bipolar structures. Additionally, the blocking voltage achieved and, thus, also the leakage current depend on the n$^-$-type doping of the basic material, which may vary relatively strongly due to the method of manufacturing. By the third semiconductor substrate structure in the first semiconductor substrate structure 132, exemplarily an n⁺-type implantation 133 in the p-well 132, below the pMOS transistors 152 of the high-voltage island, a different voltage potential between the p-wells 132, 134 illustrated and/or between the first and second semiconductor substrate structures 132 and 134 can be avoided. Thus, the influence of the parasitic PNP transistor 148 can largely be suppressed.

Thus, embodiments include a structure by which the effect of the parasitic PNP in, for example, bridge driver applications can be reduced.

In the example illustrated in FIG. 2A, the first voltage potential 136 corresponds to the high-voltage supply voltage $V_B$ and the second voltage potential corresponds to the high-voltage ground $V_S$. The semiconductor substrate structure 256 and the semiconductor substrate structure 268 and the source region of the high-voltage level shifter 162' are connected to a third voltage potential, namely the low-voltage ground $V_{COM}$.

Thus, embodiments according to FIG. 2A improve conventional concepts for a high-voltage (HV) IC technology on the basis of thin film SOI technology in that the influence of the parasitic PNP transistor below the HV circuit block/s 152, 154 is minimized. By using an additional p-well 133 in the p-islands, exemplarily 132, below the pMOS transistors 152 of the high-voltage side, it is made sure that the p-islands below the HV blocks are all at the same potential.

The semiconductor assembly discussed referring to FIG. 1C, however, cannot only be employed in the high-voltage region 220, as is illustrated in FIG. 2A, but also in the low-voltage region 210, when two separate semiconductor substrate structures of the same and/or second conductivity type, instead of the one continuous semiconductor substrate structure 256, are arranged below the pMOS transistor part 252 and the nMOS transistor part 254, respectively. Then, a parasitic bipolar transistor would also be in the low-voltage range between these two semiconductor substrate regions, the influence of which may be reduced according to FIGS. 1A-1C.

This structure of the n-well 133 in the p-island 132 can additionally be employed as ESD protective element. This is of particular importance since, due to the small Si volume available in the film 114, in thin-film SOI technology the maximally translatable ESD energy is considerably below that of the bulk Si 112 and additionally the heating from the ESD pulse (in particular in the case of a repetitive pulse) can only be dissipated by the buried oxide (BOX) to a poorer extent.

Since the transistor structure 148 is below the insulator layer and/or BOX 114, the limitations described do not apply here. Using this structure, either the ESD stability can be increased or the area for the protective structures be reduced.

Since the protective structure 148 are below the BOX 114, they can also easily be arranged below a contact area and/or PAD area, so that further area savings will result. In conventional SOI technologies, this is not possible since this is a technology including only one metallization level.

Figure 2B:
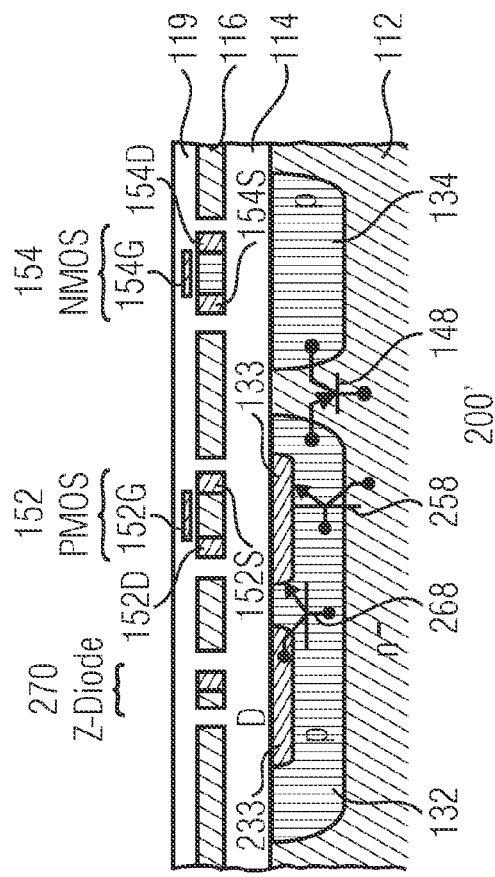
FIG. 2B illustrates an embodiment of a semiconductor assembly in SOI technology having different bipolar transistor structures in a semiconductor substrate.

FIG. 2B illustrates a semiconductor assembly according to FIG. 1C in which a fourth semiconductor substrate structure 233 of a first conductivity type is arranged in the semiconductor substrate abutting on the insulator layer 114 and otherwise surrounded by the first semiconductor substrate structure 132, wherein the fourth semiconductor substrate structure 233 is separate from the third semiconductor substrate structure 133 and laterally spaced apart from it. In addition, a Zener diode 270, abbreviated by Z diode, is formed in the semiconductor layer 216.

As can be seen from FIG. 2B, a vertical NPN transistor 258 and a lateral NPN transistor 268 are in the semiconductor assembly apart from the parasitic PNP transistor 148. The third semiconductor substrate region 133 forms the emitter, the first semiconductor substrate region 132 forms the base and the semiconductor substrate 112 forms the collector of the vertical bipolar transistor. Referring to the lateral bipolar transistor 268, the third semiconductor substrate layer 233 forms the emitter thereof, the first semiconductor substrate region 132 forms the base thereof and the fourth semiconductor substrate region 133 forms the connector thereof.

These bipolar transistor structures 148, 258 and 268 can be used as ESD protective elements, as will be discussed referring to the following FIGS. 2C-2E.

Thus, there is a way of using the "parasitic bipolar transistor" as ESD protective element, irrespective of the existence of the third and/or fourth semiconductor substrate structures 130 and 233, and a way of using the vertical bipolar transistor 258 as ESD protective elements, irrespective of the existence of the fourth semiconductor substrate structure 233.

Figure 2D:
FIG. 2D illustrates a circuit diagram of an embodiment in which a "parasitic" bipolar transistor in the semiconductor substrate according to FIGS. 1A to 2B is connected as ESD protective element.
Figure 2C:
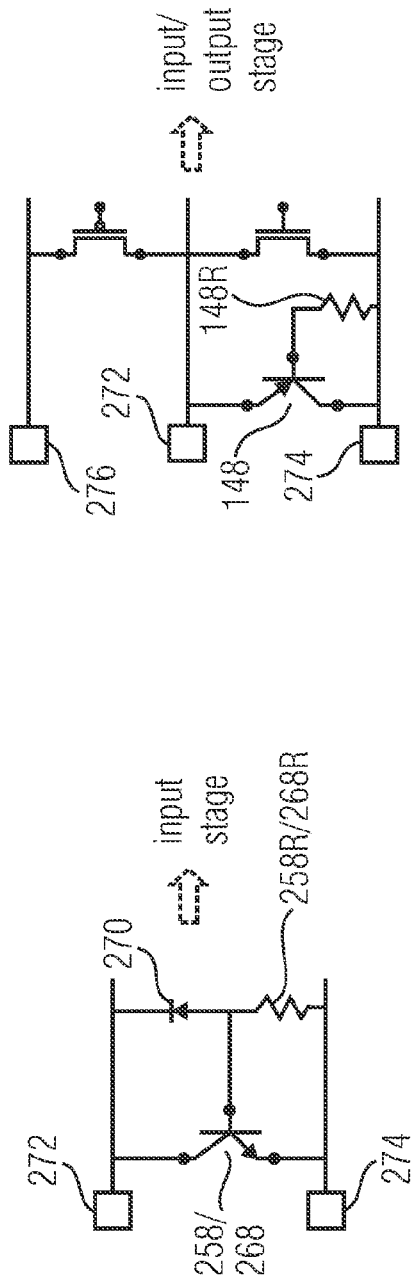
FIG. 2C illustrates a circuit diagram of an embodiment of an ESD protective circuit in which a lateral or vertical bipolar transistor according to FIG. 2B is used as ESD protective element.

FIG. 2C illustrates a circuit diagram of a first ESD element having a first contact 272 and a second contact 274 between which the vertical bipolar transistor 258 or, alternatively, the lateral bipolar transistor 268 is switched, in which optionally a Z diode 270 is coupled between the first contact 272 and the gate of the bipolar transistor 258 or 268. The reference numeral 258R and/or 268R refers to the layer resistance and/or base resistance of the vertical and lateral transistors 258 and 268, respectively. In the implementation illustrated in FIG. 2B, the vertical and horizontal bipolar transistors 258 and 268 are NPN transistors, correspondingly the reference numerals 288R/268R refer to a p-layer resistance. The first contact 262 may exemplarily be a bond wire contact or bond pad and the second contact 274 may exemplarily serve as a terminal to the voltage potential $V_S$. Referring to FIG. 2C, the input side is on the left hand side and the input stage is on the right hand side.

FIG. 2D illustrates a second embodiment of an ESD element in which the original "parasitic" bipolar transistor 148 has been considered in the design of the semiconductor assembly and is used dimensioned as ESD protective element. FIG. 2D illustrates a first contact 272, a second contact 274 and a third contact 276, wherein the bipolar transistor 246 is connected between the first contact 272 and the second contact 274 and the reference number 248R, similarly to FIG. 2C refers to the layer and/or base resistance of the bipolar transistor 148. The first contact 272 may, for example, be implemented as a bond wire contact or bond pad, the second contact 274 can be connected to the high-voltage ground $V_s$, and the third contact 276 can be connected to the high-voltage supply voltage $V_B$. Regarding FIG. 2D, the input side is on the left hand side and the input/output stage is on the right hand side.

Figure 2E:
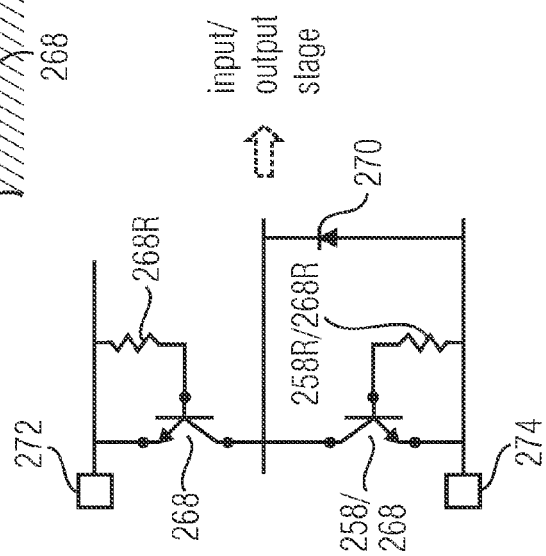
FIG. 2E illustrates a circuit diagram of another embodiment of an ESD protective circuit in which a lateral and/or vertical bipolar transistor according to FIG. 2B in the semiconductor substrate is connected as EDS protective element.

FIG. 2E illustrates a third embodiment of an ESD element having a first contact 272 and a second contact 274, wherein a lateral bipolar transistor 268 is connected, together with a lateral or vertical bipolar transistor 258/268, in series between the first contact 272 and the second contact 274, and additionally a Z-diode 270 is connected in parallel to the second contact 274 and the node between the collectors of the lateral transistor 268 and the lateral or vertical transistor 258/268. The first contact 272 according to FIG. 2E may, for example, be implemented as a bond wire contact or a bond pad and the second contact 274 exemplarily connectable to the potential $V_S$. The reference numerals 258R and/or 268R like before refer to the base and/or layer resistances of the bipolar resistors.

The voltage and/or potential difference where the bipolar transistor switches, i.e. is switched in forward direction or forward operation, depends above all on the distance between the emitter structure and the collector structure and/or the dopings of the emitter structure, the collector structure and the base structure. Frequently, the dopings of these semiconductor substrate structures are predetermined, exemplarily as global manufacturing parameters, since in the same manufacturing process in which these semiconductor substrate structures are manufactured other semiconductor substrate structures of the same conductivity type having equal doping of the same intensity are produced for different functions in the thin-film SOI structure. In this case, i.e. with a predetermined and/or unchanged doping of the semiconductor substrate structures, lateral bipolar transistor structures 268 can nevertheless be dimensioned flexibly by selecting the distance of the fourth semiconductor substrate structure to the third semiconductor substrate structure such that the bipolar transistor structure 268 switches at a predetermined difference in voltage.

Figure 3A:
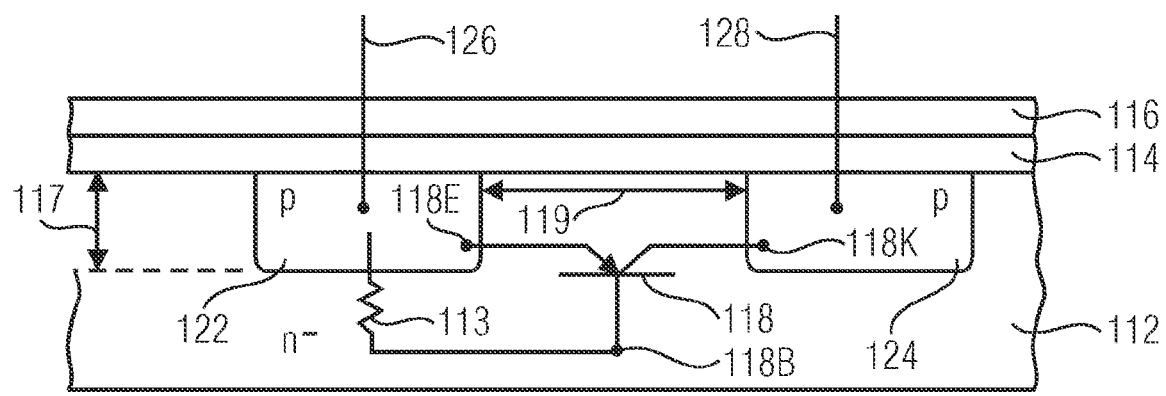
FIG. 3A illustrates another embodiment of a semiconductor assembly in thin-film SOI technology.

FIG. 3A illustrates an embodiment of a semiconductor assembly 110 in thin-film SOI technology, including a semiconductor substrate 112 of a first conductivity type, an insulator layer 114 and a semiconductor layer 116, wherein the insulator layer 114 is arranged on the semiconductor substrate and the semiconductor layer 116 is arranged on the insulator layer 114. The semiconductor assembly 110 additionally includes a first semiconductor substrate structure 122 of a second conductivity type inverse to the first conductivity type in the semiconductor substrate. In addition, the semiconductor assembly 110 includes a second semiconductor substrate structure 124 of the second conductivity type which is arranged separate and laterally spaced apart from the first semiconductor substrate structure 122 in the semiconductor substrate. Thus, the first semiconductor substrate structure 122 is connectable to a first voltage potential 126 and/or a first terminal 126 and the second semiconductor substrate structure 124 is connectable to a second voltage potential 128 different from the first voltage potential 126 and/or a different second terminal 128.

The first semiconductor substrate structure 122, the second semiconductor substrate structure 124 and the semiconductor substrate 112 form a bipolar transistor 180.

In the embodiment illustrated in FIG. 3A, the first conductivity type is generally a p-type doping and the second conductivity type generally is an n-type doping. In particular, the semiconductor substrate 112 includes an n-type doping as a first conductivity type and the first semiconductor substrate structure 122 and the second semiconductor substrate structure 124 include a p-type doping as a second conductivity type. Correspondingly, the first semiconductor substrate structure 122 forms the emitter, the second semiconductor substrate structure 124 forms the collector and the semiconductor substrate 112 forms the base of the pnp bipolar transistor 118.

In alternative embodiments, the semiconductor substrate 112 may include an n-type doping and/or the first and second semiconductor substrate structures 122, 124 include a $p^+$-type or $p^{++}$-type doping.

In still further embodiments, the first conductivity type is generally a p-type doping and the second conductivity type is generally an n-type doping. The explanation as to the dopings apply correspondingly, and the first semiconductor substrate structure 122, the second semiconductor substrate structure 124 and the semiconductor substrate 112 form an npn-transistor 118.

The electrical characteristics, such as, for example, the base bulk resistance 113 and the switching voltage of the bipolar resistor 118, are influenced by the doping of the semiconductor substrate 112, the dopings of the first and second semiconductor substrate structures 122, 124, the distance 119 between the first semiconductor substrate structure 122 and the second semiconductor substrate structure 124 and the depth 117 of the first and second semiconductor substrate structures 122 and 124, wherein the potential difference between the first semiconductor substrate structure 122 and the second semiconductor substrate structure 124 where the bipolar transistor switches, i.e. is switched in forward direction or forward operation, depends above all on the distance 119 and the dopings of the semiconductor substrate 112 and the semiconductor substrate structures 122, 124.

Frequently, the dopings of the semiconductor substrate 112 and the doping of the first and second semiconductor substrate structure structures 122, 124 are predetermined, exemplarily as global manufacturing parameters, since for example, in the same manufacturing process in which the first and second semiconductor substrate structures 122, 124 are manufactured, other semiconductor substrate structures of the same conductivity type having equal doping of the same intensity are produced for other functions in the thin-film SOI structure. In this case, i.e. with a predetermined and/or unchangeable doping of the semiconductor substrate structure of the semiconductor substrate, the distance 119 is selected such that the bipolar transistor will switch at a predetermined potential difference between the first semiconductor substrate structure 122 and the second semiconductor substrate structure 124.

Thus, embodiments of the semiconductor assemblies described before allow a simple and, at the same time, robust manner of efficiently implementing ESD protective elements in the form of bipolar transistors 118 having predetermined switching voltages and/or forward voltages in thin-film SOI structures, also in existing ones.

In embodiments which have been described referring to FIG. 3A, the semiconductor substrate 112 may be connectable or connected to a defined third voltage potential or not connected to any defined potential.

Figure 3B:
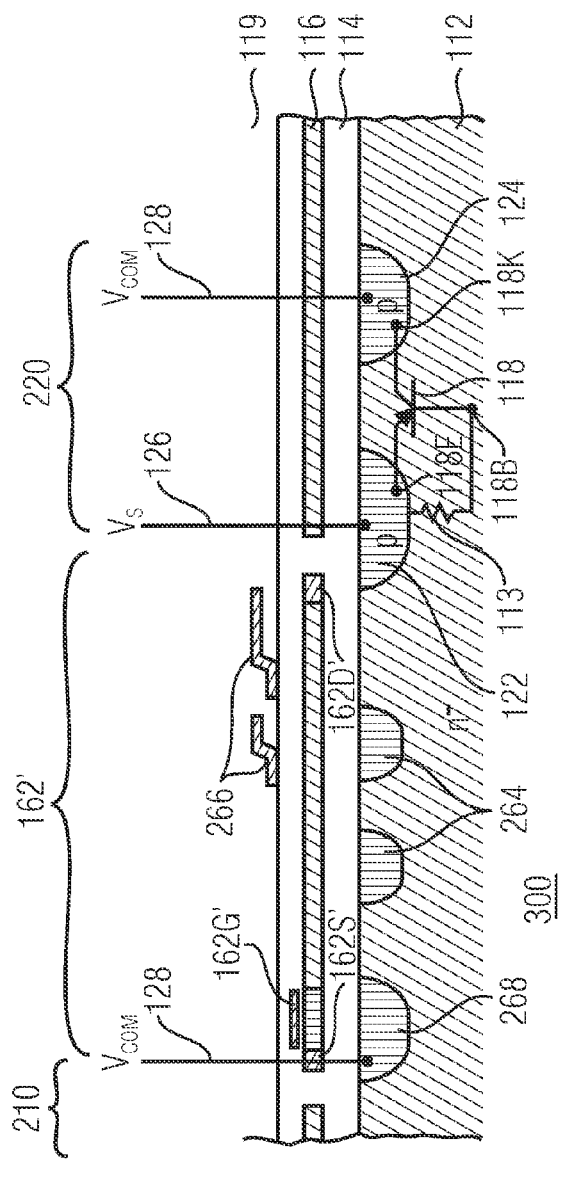
FIG. 3B illustrates an embodiment according to FIG. 3A used with a high-voltage level shifter.

FIG. 3B illustrates an embodiment according to FIG. 3A as ESD protective elements for a high-voltage level shifter 162' as has already been discussed referring to FIG. 2A.

The second semiconductor substrate structure 124 is connected to the second voltage potential 128 which in this case corresponds to the potential of the low-voltage ground $V_{COM}$. By correspondingly selecting the distance 119 with a predetermined doping of the semiconductor substrate regions and the semiconductor substrate, a potential difference between the first voltage potential $V_s$ and/or 126 and the second voltage potential $V_{COM}$ and/or 128 can be set flexibly by this assembly, where the bipolar transistor 118 is conducting and thus protects the high-voltage level shifter 162'.

Here, the second semiconductor substrate structure 124 may be an additional semiconductor substrate structure specially introduced for the ESD protective function or an existing one which is exemplarily, with regard to its distance to the first semiconductor substrate structure 122, arranged such that the predetermined protective effect is achieved.

Figure 3C:
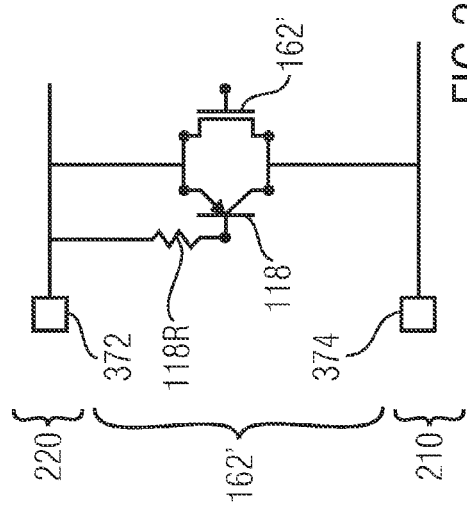
FIG. 3C illustrates a circuit diagram of an embodiment of an ESD protective circuit in which a bipolar transistor according to FIG. 3B is used as ESD protective element.

FIG. 3C illustrates a circuit diagram of an embodiment of an ESD protective element for the high-voltage level shifter 162' having a first contact 372, a second contact 374 between which the high-voltage level shifter 162' and the parasitic bipolar transistor 118 are connected in parallel to each other. The reference numeral 118R refers to the base and/or layer resistance of the bipolar transistor 118. The high-voltage ground $V_s$ is exemplarily connectable to the first contact 372 and the low-voltage ground $V_{COM}$ is connectable to the second contact 374.

The terminal of the semiconductor substrate structures 122, 124, 132, 133 and/or 134 to the respective voltage potentials may, for example, also take place externally by corresponding conductor structures within the semiconductor assembly and/or by contact pads.

Embodiments of the semiconductor assemblies may also be produced by the most different manufacturing methods. Subsequently, three different manufacturing methods will exemplarily be described as examples of the manufacturing of semiconductor assemblies according to FIGS. 1A to 2E.

Figure 4:
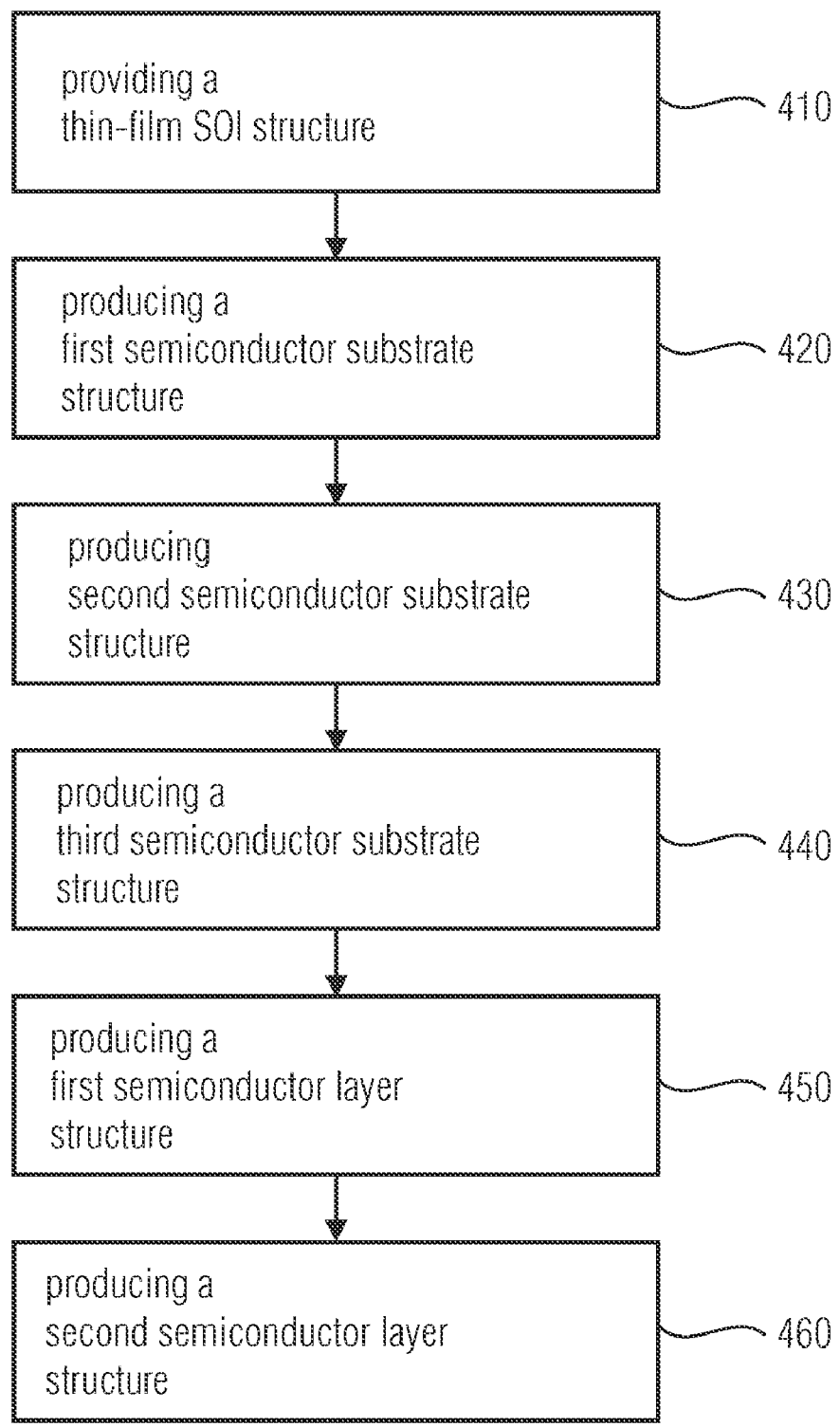
FIG. 4 illustrates a flow chart of a first embodiment of a method for manufacturing a semiconductor assembly in thin-film SOI technology according to FIGS. 1A to 2E.

In a first embodiment of a method for manufacturing a semiconductor assembly 130, 130', 130", 130''', 200, 200' in thin-film SOI technology, according to FIG. 4, at first a thin-film SOI structure is provided 410, wherein the thin-film SOI structure includes a semiconductor substrate 112 of a first conductivity type, an insulator layer 114 and a semiconductor layer 116, wherein the insulator layer 114 is arranged on the semiconductor substrate 112 and the semiconductor layer 116 is arranged on the insulator layer 114.

In addition, a first semiconductor substrate structure 132 of a second conductivity type inverse to the first conductivity type is produced 420 in the semiconductor substrate 112 and a second semiconductor substrate structure 134 of the second conductivity type which is laterally spaced apart from the first semiconductor substrate structure 132 is produced 430 in the semiconductor substrate 112.

Furthermore, a third semiconductor substrate structure 133 of the first conductivity type which is surrounded by the first semiconductor substrate structure 132 is produced 440 in the first semiconductor substrate structure 132.

Furthermore, a first semiconductor layer structure 142, 152S, 162S which is arranged above the third semiconductor substrate structure 133 is produced 450 in the semiconductor layer 116 and a second semiconductor layer structure 144, 154S, 162D which is arranged above the second semiconductor substrate structure 134 and separate and laterally spaced apart from the first semiconductor layer structure 142, 152S, 162S is produced 460 in the semiconductor layer 116.

In this embodiment, a finished SOI structure 112, 114, 116 is provided and the semiconductor substrate structures 132, 133, 134 are produced through the semiconductor layer 116 and the insulator layer 114, exemplarily by corresponding doping. This is exemplarily possible in assemblies having semiconductor layers 116 and insulator layers 114 the layer thickness of which is sufficiently thin so that the semiconductor substrate 112 can be doped through it.

Figure 5:
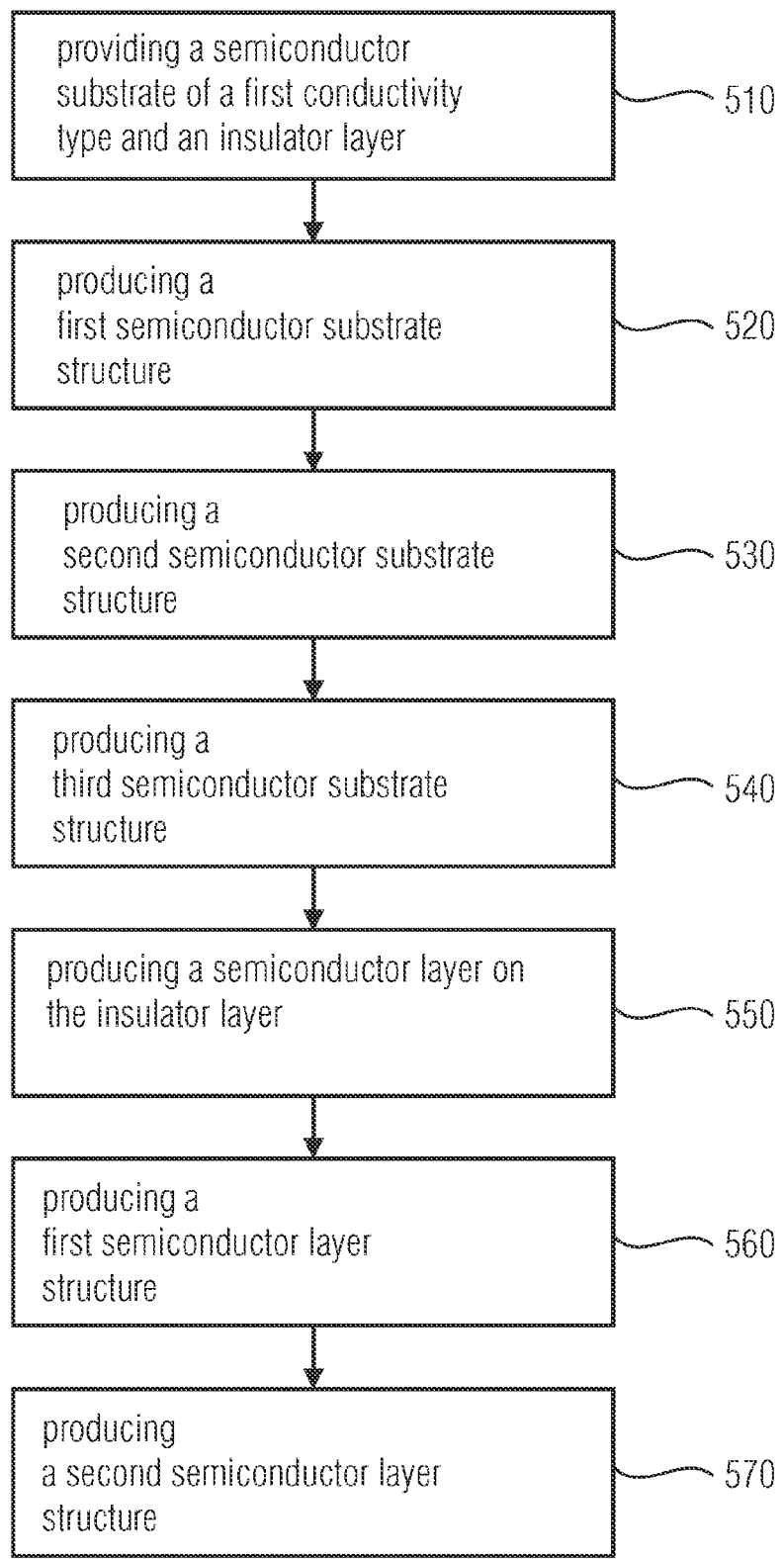
FIG. 5 illustrates a flow chart of a second embodiment of a method for manufacturing a semiconductor assembly in thin-film SOI technology according to FIGS. 1A to 2E.

In a second embodiment of a method for manufacturing a semiconductor assembly 130, 130', 130", 130''' in thin-film SOI technology, according to FIG. 5, a semiconductor substrate 112 of a first conductivity type and an insulator layer 114 are provided 510, wherein the insulator layer is arranged on the semiconductor substrate 112.

Starting from this, a first semiconductor substrate structure 132 of a second conductivity type inverse to the first conductivity type is produced 520 in the semiconductor substrate 112, a second semiconductor substrate structure 134 of the second conductivity type which is laterally spaced apart from the first semiconductor substrate structure 132 is produced 530 in the semiconductor substrate 112 and a third semiconductor substrate structure 133 of the first conductivity type which is surrounded by the first semiconductor substrate structure 132 is produced 540 in the first semiconductor substrate structure 132.

In addition, a semiconductor layer 116 is produced 550 on the insulator layer 114 to obtain an SOI structure, and a first semiconductor layer structure 142, 152S, 162S which is arranged above the third semiconductor substrate structure 133 is produced 560 in the semiconductor layer 116, and a second semiconductor layer structure 144, 154S, 162D which is arranged above the second semiconductor substrate structure 134, separate and laterally spaced apart from the first semiconductor layer region 142, 152S, 162S is produced 570 in the semiconductor layer 116.

In this embodiment, only the semiconductor substrate 112 and the insulator layer 114 are provided and the semiconductor substrate structures 132, 133, 134, are produced through the insulator layer, exemplarily by corresponding doping. These embodiments may exemplarily be employed in "wafer bonding" methods, where a second substrate forming the semiconductor layer 116 is deposited on a first substrate 112 having the insulator layer 114 and then those portions not forming the semiconductor layer 116 are again removed from the second substrate.

Figure 6:
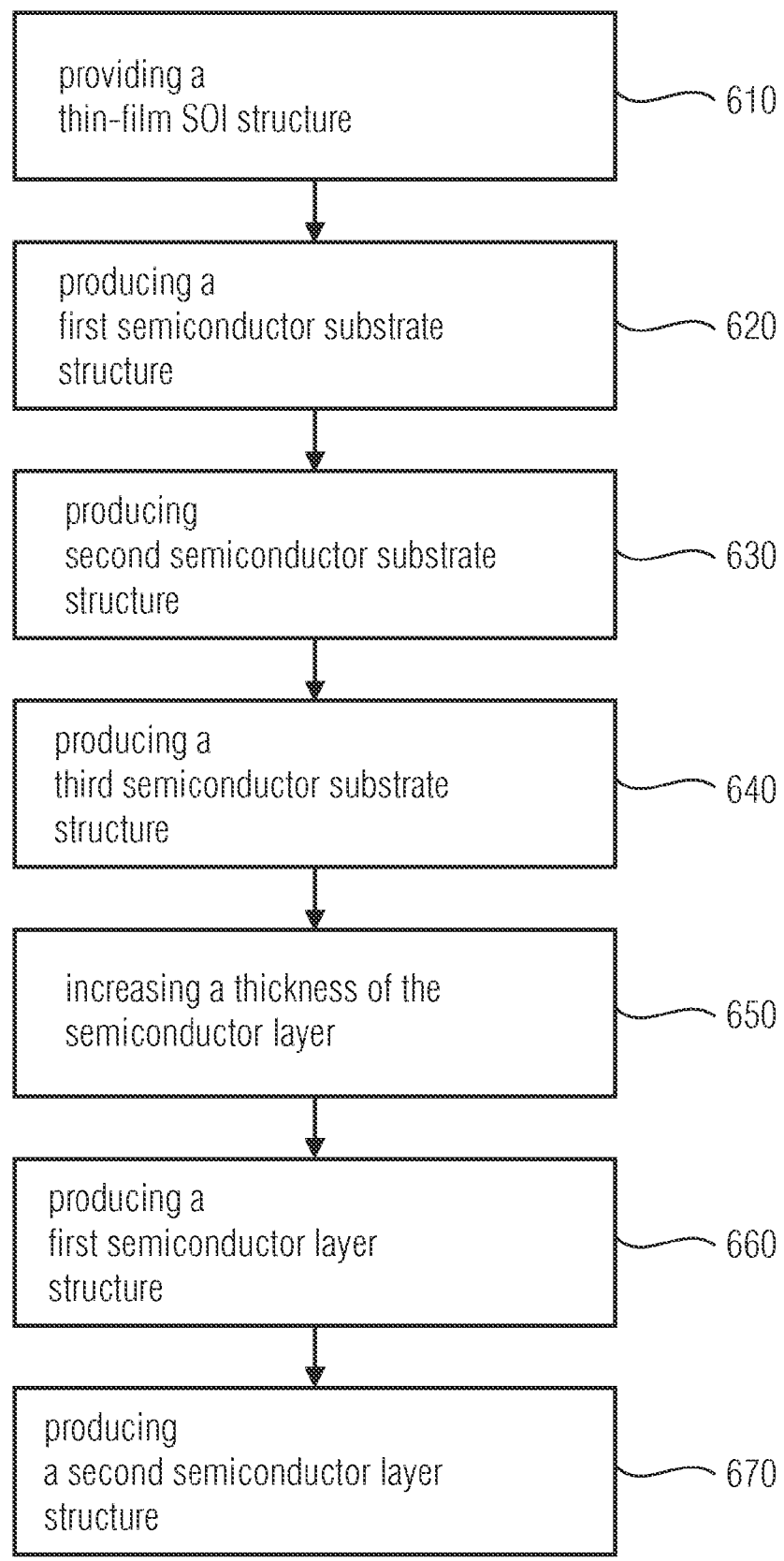
FIG. 6 illustrates a flow chart of a third embodiment of a method for manufacturing a s semiconductor assembly in thin-film SOI technology according to FIGS. 1A to 2E.

In a third embodiment of a method for manufacturing a semiconductor assembly 130, 130', 130", 130''', 200, 200' in thin-film SOI technology, according to FIG. 6, a thin-film SOI structure which includes a semiconductor substrate 112 of a first conductivity type, an insulator layer 114 and a semiconductor layer 116 is provided 610, wherein the insulator layer 114 is arranged on the semiconductor substrate 112 and the semiconductor layer 116 is arranged on the insulator layer 114.

Based on the thin-film SOI structure, a first semiconductor substrate structure 132 of a second conductivity type inverse to the first conductivity type is produced 620 in the semiconductor substrate 112, a second semiconductor substrate structure 134 of the second conductivity type which is laterally spaced apart from the first semiconductor substrate structure 132 is produced 630 in the semiconductor substrate 112, and a third semiconductor substrate structure 133 of the first conductivity type which is surrounded by the first semiconductor substrate structure 132 is produced 640 in the first semiconductor substrate structure 132.

In addition, a thickness of the semiconductor layer 116 on the insulator layer is increased 650, a first semiconductor layer structure 142, 152S, 162S which is arranged above the third semiconductor substrate structure 133 is produced 660 in the semiconductor layer 116, and a second semiconductor layer structure 144, 154S, 162D which is arranged above the second semiconductor substrate structure 134 and separate and laterally spaced apart from the first semiconductor layer region 142, 152S, 162S is produced 670 in the semiconductor layer 116.

In this embodiment, a thin-film SOI structure is exemplarily provided in which the insulator layer 114 and the semiconductor layer 116 are sufficiently thin to produce the semiconductor substrate structures 132, 133, 134 through same, exemplarily by doping, and in which the semiconductor layer is only brought to its final thickness after that. This may exemplarily be of advantage when requiring SOI structures the thickness of the insulator layer 114 and the semiconductor layer 116 of which actually is too great to perform doping through same like in the first embodiment.

Figure 7:
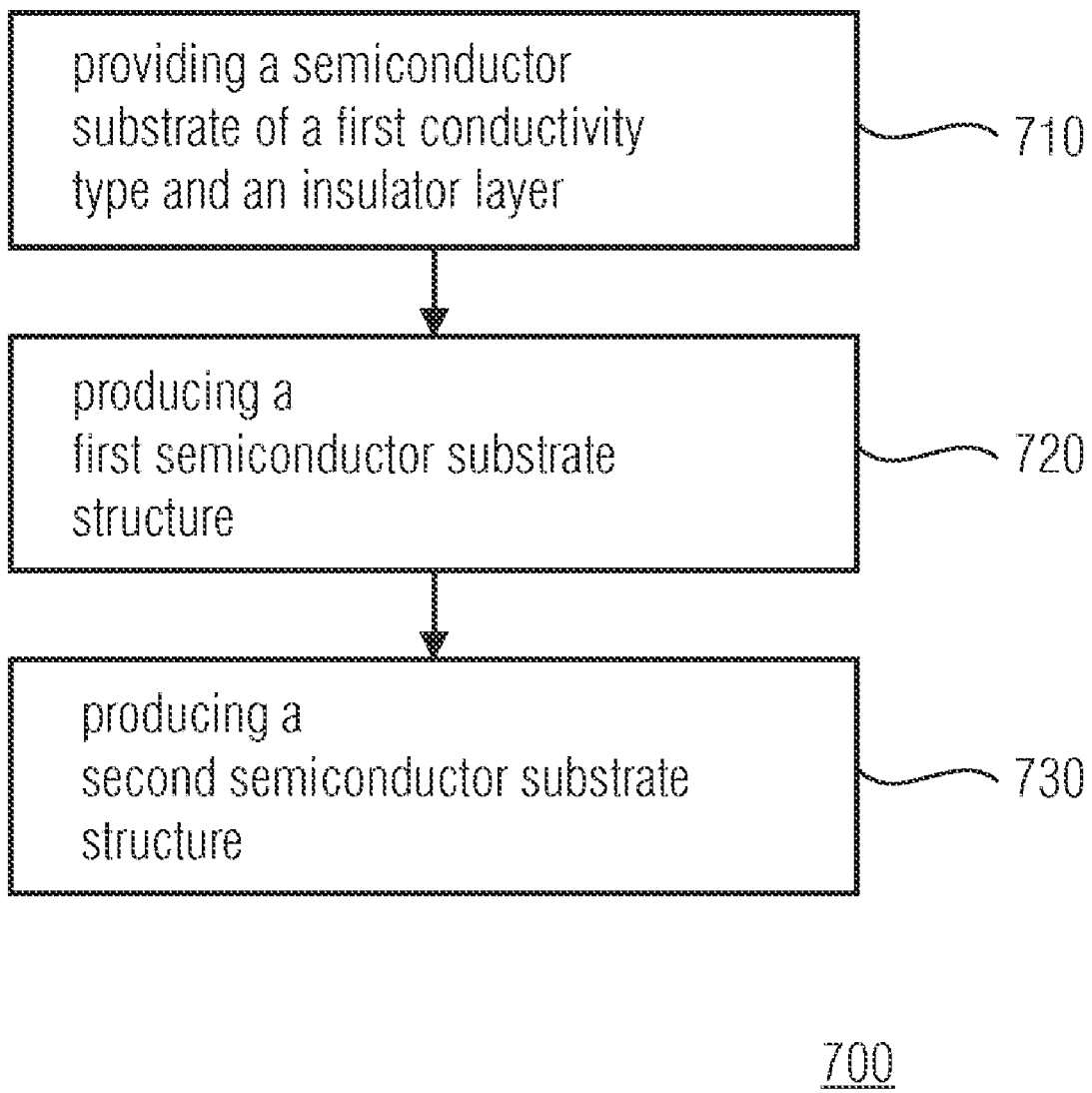
FIG. 7 illustrates a flow chart of an embodiment of a method for manufacturing a s semiconductor assembly in thin-film SOI technology according to FIGS. 3A to 3C.

In one embodiment of a method for manufacturing a semiconductor assembly 110, 300 in thin-film SOI technology, according to FIGS. 3A to 3C, exemplarily a high-voltage level shifter assembly 162, according to FIG. 7, at first a thin-film SOI structure which includes a semiconductor substrate 112 of a first conductivity type and includes an insulator layer 114 and a semiconductor layer 116 is provided 710, wherein the insulator layer 114 is arranged on the semiconductor substrate 112 and the semiconductor layer 116 is arranged on the insulator layer 114.

Based thereon, a first semiconductor substrate structure 122 is produced 720 in the semiconductor substrate 112, wherein the first semiconductor substrate structure 122 includes a second conductivity type inverse to the first conductivity type, and wherein the first semiconductor substrate structure 122 is connectable to a first voltage potential 126.

In addition, a second semiconductor substrate structure 124 is produced 730 in the semiconductor substrate 112, wherein the second semiconductor substrate structure 124 is arranged separate and laterally spaced apart from the first semiconductor substrate structure 122, wherein the second semiconductor substrate structure 124 includes the second conductivity type, and wherein the second semiconductor substrate structure 124 is connectable to a second voltage potential 128 different from the first voltage potential 126, and wherein the first semiconductor substrate structure 122 and the second semiconductor substrate structure 124 are produced spaced apart 119 such that a bipolar transistor 118 formed by the first semiconductor substrate structure 124 and the semiconductor substrate 112 switches at a predetermined potential difference between the first semiconductor substrate structure 122 and the second semiconductor substrate structure 124.

This embodiment corresponds to the basic method, as has been described in the first embodiment according to FIG. 4, for FIGS. 1A to 2E. Alternatively, methods according to the second embodiment (see FIG. 5) and third embodiment (see FIG. 6) may also be used in analogy for manufacturing semiconductor assemblies according to FIGS. 3A to 3C.

In summary, it can be stated that embodiments of the semiconductor assembly allow that all the p-wells within the high-voltage side are at a potential by introducing another n-well in the p-islands.

This structure (n-well 133 in p-island 132 below BOX 114) can then additionally be used for improving the ESD stability and/or chip area reduction (smaller areas for the ESD protective structures). Due to the thin silicon film thickness of the SOI technology, the ESD stability is limited conceptually since the energy of the ESD pulse typically has to be degraded in the silicon film 116 which additionally, due to the BOX 114, has poor thermal coupling. The ESD protection is conventionally realized by large-area Z-diodes at the input/output pads or contacts. The voltage level shifting structures are conventionally not ESD-protected. It is now possible by the structure suggested to dissipate part of the ESD energy to the silicon substrate 112 below the BOX 114. Thus, the area requirements of ESD protective structures can be reduced and/or the ESD stability can be increased. Embodiments allow ESD protective functions for a plurality of applications, including high-voltage driver stages and high-voltage level shifters.

In particular, embodiments in which the first conductivity type is an n-type doping and the second conductivity type is a p-type doping have been described before. The respective explanations, however, are equally true for embodiments in which the first conductivity type is a p-type doping and the second conductivity type is an n-type doping.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. An integrated circuit comprising:
a semiconductor assembly in thin-film silicon on insulator technology comprising:
a semiconductor substrate of a first conductivity type, an insulator layer, and a semiconductor layer;
a first well of a second conductivity type arranged in the semiconductor substrate below a first semiconductor layer structure;
a second well of the second conductivity type which is arranged in the semiconductor substrate below a second semiconductor layer structure;
a third well of the first conductivity type which is arranged below the first semiconductor layer structure in the first well; and
a voltage line,
wherein the first well, the semiconductor substrate and the second well form a bipolar transistor structure, and
wherein the first well and the second well are connected to the voltage line.

2. The integrated circuit of claim 1, comprising:
where the first semiconductor layer structure in the semiconductor layer is connectable to a first voltage potential; and
where the second semiconductor layer structure in the semiconductor layer is spaced apart from the first semiconductor layer structure and connectable to a second voltage potential.

3. The integrated circuit of claim 1, wherein the third well is completely surrounded by the first well.

4. The integrated circuit of claim 1, wherein the first conductivity type is an n-type doping and the second conductivity type is a p-type doping.

5. The integrated circuit of claim 1, comprising:
a component formed by the semiconductor assembly.

6. The integrated circuit of claim 5, comprising:
where the component is a transistor.

7. The integrated circuit of claim 1, wherein the first well forms an emitter, the semiconductor substrate forms a base and the second well forms a collector of the bipolar transistor structure.

8. The integrated circuit of claim 1, comprising:
a further voltage line,
wherein the first semiconductor layer structure and the third well are connected to the further voltage line, and
wherein the second semiconductor layer structure is connected to the voltage line.

9. A semiconductor assembly in thin-film 501 (Silicon on Insulator) technology comprising a semiconductor substrate of a first conductivity type, an insulator layer and a semiconductor layer, the insulator layer being arranged on the semiconductor substrate and the semiconductor layer being arranged on the insulator layer, further comprising:
a first semiconductor layer structure in the semiconductor layer, wherein the first semiconductor layer structure is connectable to a first voltage potential;
a second semiconductor layer structure in the semiconductor layer which is separate and laterally spaced apart from the first semiconductor layer structure, wherein the second semiconductor layer structure is connectable to a second voltage potential;
a first well of a second conductivity type inverse to the first conductivity type which is arranged in the semiconductor substrate below the first semiconductor layer structure;

a second well of the second conductivity type which is arranged in the semiconductor substrate below the second semiconductor layer structure and laterally spaced apart from the first well;

a third well of the first conductivity type which is arranged below the first semiconductor layer structure and in the first well; and a voltage line, wherein the first well, the semiconductor substrate and the second well form a bipolar transistor structure, and wherein the first well and the second well are connected to the voltage line.

10. The semiconductor assembly of claim 9, wherein the third well is completely surrounded by the first well.

11. The semiconductor assembly of claim 10, wherein the first conductivity type is an n-type doping and the second conductivity type is a p-type doping.

12. The integrated circuit of claim 11, comprising:
a further voltage line,
wherein the first semiconductor layer structure and the third well are connected to the further voltage line, and
wherein the second semiconductor layer structure is connected to the voltage line.

13. The semiconductor assembly of claim 10, wherein the semiconductor substrate comprises an n⁻-type doping, the first and the second wells comprise a p-type doping and the third well comprises an n-type or n⁺-type doping.

14. The semiconductor assembly of claim 10, wherein the first semiconductor layer structure and the second semiconductor layer structure are parts of a semiconductor device.

15. The semiconductor assembly of claim 13, wherein the semiconductor device is a voltage level shifter.

16. The semiconductor assembly of claim 10, wherein the first semiconductor layer structure is a source structure or field structure of a voltage level shifter, and the second semiconductor layer structure is a drain structure or field structure of a voltage level shifter.

17. The semiconductor assembly of claim 10, which is a CMOS (Complementary Metal Oxide Semiconductor) assembly comprising a pMOS transistor and an nMOS transistor, wherein the first semiconductor layer structure is part of the pMOS transistor and the second semiconductor layer structure is part of the nMOS transistor or vice versa.

18. The semiconductor assembly of claim 17, wherein the first semiconductor layer structure is part of the pMOS transistor, the first conductivity type is an n-type doping and the second conductivity type is a p-type doping.

19. The semiconductor assembly of claim 17, wherein the first semiconductor layer structure is part of the nMOS transistor, the first conductivity type is a p-type doping and the second conductivity type is an n-type doping.

20. The integrated circuit of claim 17, wherein the first semiconductor layer structure is a source structure of the pMOS transistor and the second semiconductor layer structure is a source structure of the nMOS transistor or vice versa.

21. The semiconductor assembly of claim 10, wherein the first well and the second well are electrically coupled.

22. The semiconductor assembly of claim 10, wherein the same voltage potential is applied to the first well and to the second well.

23. The semiconductor assembly of claim 10, wherein the third well is implemented to obtain, when applying the first voltage potential to it, a p-n junction between the first well and the third well in reverse direction.

24. The semiconductor assembly of claim 10, wherein the third well, the first well and the semiconductor substrate form a vertical bipolar transistor which is implemented as an ESD (Electrostatic Discharge) protective element.

25. The semiconductor assembly of claim 10, comprising:
a fourth well of the first conductivity type which is arranged in the semiconductor substrate abutting on the insulator layer and is otherwise surrounded by the first well, wherein the fourth well is separate from the third well and laterally spaced apart from it.

26. The semiconductor assembly of claim 25, wherein the fourth well, the first well and the third well form a lateral bipolar transistor which is implemented as an ESD protective element.

27. A CMOS semiconductor assembly in thin-film SOI technology comprising a semiconductor substrate having an n-type doping, an insulator layer and a semiconductor layer, the insulator layer being arranged on the semiconductor substrate and the semiconductor layer being arranged on the insulator layer, further comprising:
a first semiconductor layer structure in the semiconductor layer which is part of a pMOS transistor of the CMOS semiconductor assembly;
a second semiconductor layer structure in the semiconductor layer which is part of an nMOS transistor of the CMOS semiconductor assembly;
a first well comprising a p-type doping which is arranged in the semiconductor substrate below the first semiconductor layer structure;
a second well comprising a p-type doping which is arranged in the semiconductor substrate below the second semiconductor layer structure and is separate and laterally spaced apart from the first well;
a third well comprising an n⁺-type doping which is arranged below the first semiconductor layer structure in the first well; and
a voltage line,
wherein the first well, the semiconductor substrate and the second well form a bipolar transistor structure, and
wherein the first well and the second well are connected to the voltage line.

28. A method for manufacturing a semiconductor assembly in thin-film SOI technology, comprising:
providing a thin-film SOI structure comprising a semiconductor substrate of a first conductivity type, an insulator layer and a semiconductor layer, the insulator layer being arranged on the semiconductor substrate and the semiconductor layer being arranged on the insulator layer;
producing a first well of a second conductivity type inverse to the first conductivity type in the semiconductor substrate;
producing a second well of the second conductivity type which is laterally spaced apart from the first well in the semiconductor substrate;
producing a third well of the first conductivity type in the first well;
producing a first semiconductor layer structure which is arranged above the third well in the semiconductor layer;
producing a second semiconductor layer structure which is arranged above the second well separate and laterally spaced apart from the first semiconductor layer structure in the semiconductor layer; and
producing a voltage line,
wherein the first well, the semiconductor substrate and the second well form a bipolar transistor structure, and
wherein the first well and the second well are connected to the voltage line.

29. A method for manufacturing a semiconductor assembly in thin-film SOI technology, comprising:
- providing a semiconductor substrate of a first conductivity type and an insulator layer, the insulator layer being arranged on the semiconductor substrate;
- producing a first well of a second conductivity type inverse to the first conductivity type in the semiconductor substrate;
- producing a second well of the second conductivity type which is laterally spaced apart from the first well in the semiconductor substrate;
- producing a third well of the first conductivity type in the first well;
- producing a semiconductor layer on the insulator layer to obtain an SOI structure;
- producing a first semiconductor layer structure which is arranged above the third well in the semiconductor layer;
- producing a second semiconductor layer structure which is arranged above the second well separate and laterally spaced apart from the first semiconductor layer region in the semiconductor layer; and
- producing a voltage line,
- wherein the first well, the semiconductor substrate and the second well form a bipolar transistor structure, and
- wherein the first well and the second well are connected to the voltage line.

30. A method for manufacturing a semiconductor assembly in thin-film SOI technology, comprising:
- providing a thin-film SOI structure comprising a semiconductor substrate of a first conductivity type, an insulator layer and a semiconductor layer, the insulator layer being arranged on the semiconductor substrate and the semiconductor layer being arranged on the insulator layer;
- producing a first well of a second conductivity type inverse to the first conductivity type in the semiconductor substrate;
- producing a second well of the second conductivity type which is laterally spaced apart from the first well in the semiconductor substrate;
- producing a third well of the first conductivity type in the first well;
- increasing a thickness of the semiconductor layer on the insulator layer;
- producing a first semiconductor layer structure which is arranged above the third well in the semiconductor layer;
- producing a second semiconductor layer structure which is arranged above the second well separate and laterally spaced apart from the first semiconductor layer region in the semiconductor layer; and
- producing a voltage line,
- wherein the first well, the semiconductor substrate and the second well form a bipolar transistor structure, and
- wherein the first well and the second well are connected to the voltage line.

* * * * *